(12) United States Patent
Bash et al.

(10) Patent No.: US 7,315,448 B1
(45) Date of Patent: Jan. 1, 2008

(54) AIR-COOLED HEAT GENERATING DEVICE AIRFLOW CONTROL SYSTEM

(75) Inventors: Cullen E. Bash, San Francisco, CA (US); Abdlmonem H. Beitelmal, Los Altos, CA (US); Ratnesh K. Sharma, Union City, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 283 days.

(21) Appl. No.: 11/142,557

(22) Filed: Jun. 1, 2005

(51) Int. Cl.
*H05K 7/20* (2006.01)
*F25D 23/12* (2006.01)
*F28F 7/00* (2006.01)
*H05K 5/00* (2006.01)

(52) U.S. Cl. .............. 361/701; 361/696; 62/259.2; 165/80.3; 454/184

(58) Field of Classification Search ........ 361/699–702, 361/724–727, 696; 62/259.2; 257/714; 174/15.1, 15.2, 252; 165/80.4, 80.5, 104.33; 454/229
See application file for complete search history.

(56) References Cited

U.S. PATENT DOCUMENTS

| | | | | |
|---|---|---|---|---|
| 4,997,031 A | * | 3/1991 | Kashiwada et al. | ......... 165/282 |
| 5,791,983 A | * | 8/1998 | Robertson | .................... 454/229 |
| 6,182,742 B1 | * | 2/2001 | Takahashi et al. | ..... 165/104.33 |
| 6,415,619 B1 | | 7/2002 | Bash et al. | |
| 6,490,877 B2 | | 12/2002 | Bash et al. | |
| 6,574,104 B2 | * | 6/2003 | Patel et al. | ................. 361/695 |
| 6,628,520 B2 | | 9/2003 | Patel et al. | |
| 6,772,604 B2 | * | 8/2004 | Bash et al. | ................ 62/259.2 |
| 6,775,997 B2 | * | 8/2004 | Bash et al. | .................... 62/180 |
| 6,832,489 B2 | * | 12/2004 | Bash et al. | .................... 62/180 |
| 6,832,490 B2 | * | 12/2004 | Bash et al. | .................... 62/180 |
| 6,834,512 B2 | * | 12/2004 | Bash et al. | .................... 62/180 |
| 6,854,284 B2 | * | 2/2005 | Bash et al. | .................... 62/180 |
| 6,868,683 B2 | * | 3/2005 | Bash et al. | .................... 62/180 |
| 6,876,549 B2 | * | 4/2005 | Beitelmal et al. | ........... 361/692 |
| 6,945,058 B2 | * | 9/2005 | Bash et al. | ..................... 62/89 |
| 6,981,915 B2 | * | 1/2006 | Moore et al. | ................ 454/184 |
| 7,010,392 B2 | * | 3/2006 | Bash et al. | ................. 700/276 |

(Continued)

OTHER PUBLICATIONS

U.S. Appl. No. 11/142,558 to Bash et al. filed Jun. 1, 2005.*
U.S. Appl. No. 10/780,631 to Bash et al. filed Feb. 19, 2004.*
U.S. Appl. No. 10/853,529 to Bash et al. filed May 26, 2004.*

*Primary Examiner*—Jayprakash Gandhi
*Assistant Examiner*—Zachary M Pape

(57) ABSTRACT

A system for controlling airflow around an air-cooled heat generating device includes a cooling fluid line and heat exchangers positioned along the cooling fluid line to cool airflow around components in the heat generating device. The heat exchangers are positioned adjacent to the heat generating device such that the heat exchangers are directly in the path of at least one of airflow supplied into the components and airflow exhausted from the components. The system also includes valves positioned along the cooling fluid line to control cooling fluid flow through respective heat exchangers. The system further includes a secondary heat exchanger configured to absorb heat from the cooling fluid and a controller configured to control the valves to thereby control the cooling fluid flow through the heat exchangers.

19 Claims, 8 Drawing Sheets

U.S. PATENT DOCUMENTS 7,086,459 B2* 8/2006 Beitelmal et al. ........... 165/205
2004/0050231 A1* 3/2004 Chu et al. ..................... 83/574
2005/0122685 A1* 6/2005 Chu et al. ................... 361/699
2005/0207116 A1* 9/2005 Yatskov et al. ............. 361/690

* cited by examiner

AIR-COOLED HEAT GENERATING DEVICE AIRFLOW CONTROL SYSTEM

CROSS-REFERENCE TO OTHER APPLICATIONS

The present application has the same Assignee and shares some common subject matter with U.S. patent application Ser. No. 11/142,558, entitled "Refrigeration System with Parallel Evaporators and Variable Speed Compressor", filed on even date herewith, and U.S. patent application Ser. No. 11/142,556 entitled "Air-Cooled Device Refrigeration System with Parallel Evaporators", filed on even date herewith. The disclosures of the above-listed applications are incorporated herein by reference in their entireties.

BACKGROUND

A data center may be defined as a location, for instance, a room that houses computer systems arranged in a number of racks. A standard rack, for instance, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Some of the racks contained in the data center may dissipate greater levels of heat as compared to other racks in the data center. This may occur, for instance, in situations where some of the racks contain greater densities of computer systems or a larger number of computer systems that are operating at higher levels. Conventional data centers are typically equipped with a raised floor with static ventilation tiles configured to provide cool air to the computer systems from a pressurized plenum in the space below the raised floor. In most instances, the level and temperature of the airflow supplied through the ventilation tiles is the same or similar for all of the ventilation tiles. As such, those racks that dissipate greater levels of heat often receive cooling airflow that is insufficient to maintain the temperatures of the computer systems contained therein within predefined parameters. This may lead to a shutdown or damage to the computer systems.

It would thus be desirable to ensure that the computer systems in the racks receive airflow at sufficient levels and at adequate temperatures.

SUMMARY

A system for controlling airflow around a heat generating device is disclosed herein. The system includes a cooling fluid line and heat exchangers positioned along the cooling fluid line to cool airflow around components in the heat generating device. The heat exchangers are positioned adjacent to the heat generating device such that the heat exchangers are directly in the path of at least one of airflow supplied into the components and airflow exhausted from the components. The system also includes valves positioned along the cooling fluid line to control cooling fluid flow through respective heat exchangers. The system further includes a secondary heat exchanger configured to absorb heat from the cooling fluid and a controller configured to control the valves to thereby control the cooling fluid flow through the heat exchangers.

BRIEF DESCRIPTION OF THE DRAWINGS

Features of the present invention will become apparent to those skilled in the art from the following description with reference to the figures, in which.

DETAILED DESCRIPTION

Figure 1A:
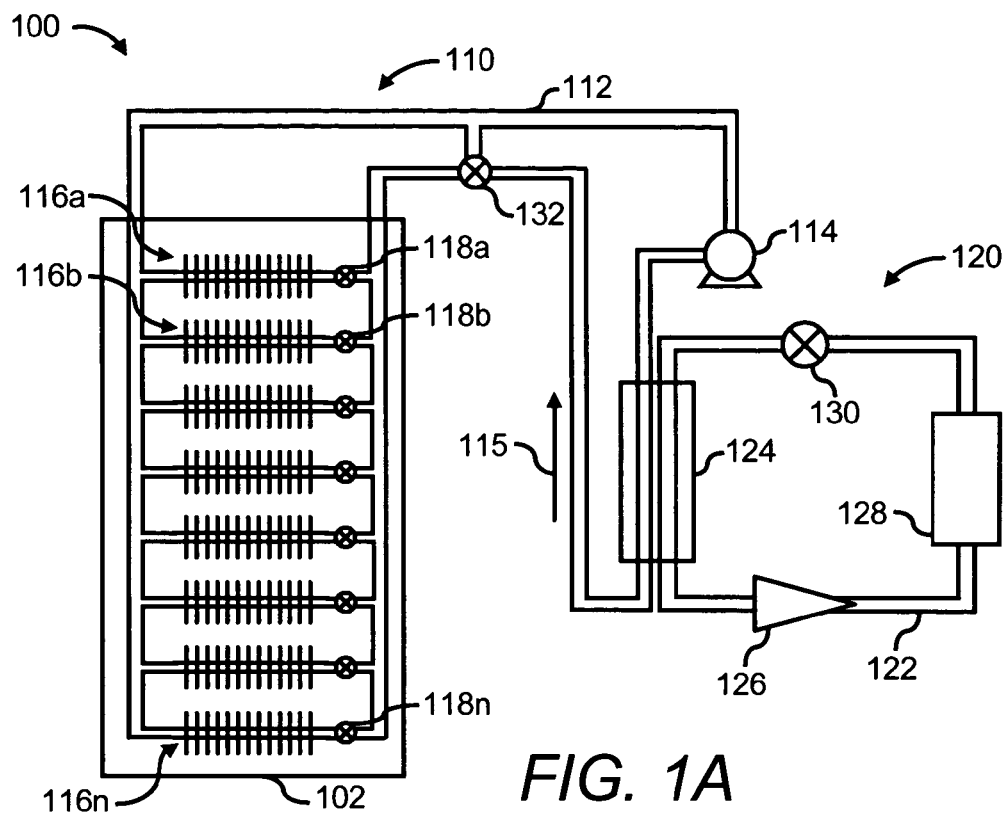
FIG. 1A shows a simplified schematic illustration of a device-level cooling system, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Broadly speaking, airflow characteristics around various sections of an air-cooled heat generating device may be individually controlled through implementation of various examples as described herein below. The various sections may comprise locations in a front or rear of the heat generating device. Thus, characteristics of air flowing into the heat generating device, characteristics of air flowing out of the heat generating device, or both, may be modified. The various sections may also comprise different levels of the heat generating device, different locations within a heat generating device, etc. More particularly, the granularity at which the airflow characteristics are modified may also be controlled.

The characteristics of the airflow may be modified through use of heat exchangers positioned in the path of the airflow around the heat generating device. In a first example, the heat exchangers are positioned near inlets of the heat generating device, such that, the heat exchangers are in the paths of the airflow flowing into the heat generating device. In this example, the heat exchangers generally operate to reduce the temperature of the airflow flowing into the heat generating device.

In a second example, the heat exchangers are positioned near the outlets of the heat generating device, such that, the heat exchangers are in the path of the airflow exhausting from the heat generating device. In this example, the heat exchangers generally operate to reduce the temperature of the airflow exhausted from the heat generating device. In one regard, the reduction of the exhaust air temperature may reduce the overall temperature of the air in a room housing the heat generating device, for instance. As such, the airflow that may be re-circulated, that is, exhausted air that is drawn into the heat generating device, may be at a lower temperature, thereby relatively increasing the ability of the airflow to remove heat from the components in the heat generating device.

In a third example, the heat exchangers are positioned near both the inlets and outlets of the heat generating device. This configuration of heat exchangers may be implemented in a heat generating device having a relatively high power density, for instance, in excess of 15 kW.

In any of the examples described above, the heat exchangers may be employed as part of a cooling system that is supplemental to a cooling system of a room. Thus, for instance, substantially only those heat generating device having relatively high power densities, for instance, in excess of 15 kW, may be equipped with the heat exchangers. In one regard, the heat exchangers may be employed to generally ensure that the temperatures of the airflow supplied to the components in the heat generating device are at rated levels. In another regard, the heat exchangers may be employed to generally ensure that the temperatures of the airflow supplied into or exhausted from the heat generating device are uniform for a plurality of heat generating devices.

With reference first to FIG. 1A, there is shown a simplified schematic illustration of a device-level cooling system 100, according to a first example. It should be readily apparent to those of ordinary skill in the art that the device-level cooling system 100 depicted in FIG. 1A represents a generalized illustration and that other components may be added or existing components may be removed or modified without departing from a scope of the device-level cooling system 100. For example, the device-level cooling system 100 may include any number of heat exchangers, valves, and various other components.

The device-level cooling system 100 is generally configured to manipulate airflow temperatures around various sections of a heat generating device 102 designed to be air-cooled. By way of example, the heat generating device 102 may comprise a standard electronics cabinet configured to house a plurality of components capable of generating/dissipating heat (not shown), for instance, processors, micro-controllers, high-speed video cards, memories, semiconductor devices, and the like. The components may be elements of a plurality of subsystems (not shown), for instance, computers, servers, hard drives, monitors, memories, etc. The subsystems and the components, hereinafter called heat generating devices, may be implemented to perform various electronic, for instance, computing, switching, routing, displaying, and the like, functions.

The heat generating components may be arranged in the heat generating device 102 in any reasonably suitable manner. For instance, the heat generating components may be positioned horizontally on respective levels of the heat generating device 102. In addition, or alternatively, the heat generating components may be positioned vertically on respective levels of the heat generating device 102, such that a number of heat generating components are arranged on the respective levels of the heat generating device 102.

Also shown in FIG. 1A is a cooling device 110 that may be employed to substantially control the temperature of the airflow supplied into the heat generating device 102 to cool the heat generating components. In addition, or alternatively, the cooling device 110 may be employed to substantially control the temperature of the airflow exhausted from the heat generating device 102. In the first instance, the cooling device 110 may be positioned upstream from a cooling airflow supplied into the heat generating device 102. In the second instance, the cooling device 110 may be positioned downstream of the cooling airflow exhausted from the heat generating device 102. The cooling device 110 may be positioned to cool the airflow exhausted from the heat generating device 102 in situations, for instance, where there is a relatively high level of heated air infiltration into the cooling airflow supplied into the heat generating device 102 or into other heat generating devices.

In any respect, the cooling device 110 includes a coolant line 112 through which a coolant flows. Positioned along the coolant line 112 is a pump 114 configured to apply pressure on the coolant to thereby cause the coolant to flow through the coolant line 112 in the direction indicated by the arrow 115. Also positioned along the coolant line are heat exchangers 116a-116n, where "n" is an integer greater than one. Although a plurality of heat exchangers 116a-116n have been illustrated in FIG. 1A, it should be understood that any reasonably suitable number of heat exchangers, including a single heat exchanger 116a, may be employed to cool heat generating components contained in the heat generating device 102.

As shown, the heat exchangers 116a-116n include structures, such as, fins, or other structures having relatively large surface areas, for cooling airflow that passes by the heat exchangers 116a-116n. Thus, as the airflow passes by the heat exchangers 116a-116, the airflow is cooled through transfer of heat into the coolant flowing through the heat exchangers 116a-116n. In addition, as shown in FIG. 1A, positioned upstream of each of the heat exchangers 116a-116n along the cooling line 112 are respective valves 118a-118n, where "n" is an integer equal to or greater than one. The valves 118a-118n generally control the flow of coolant through each of the heat exchangers 116a-116n to thereby control the temperatures of the airflows passing by or through the heat exchangers 116a-116n. More particularly, for instance, the valves 118a-118n may enable a greater amount of coolant flow through the heat exchangers 116a-116n to enable a greater amount of heat transfer between the airflows and the coolant, to thereby reduce the temperatures of the airflows. In addition, the valves 118a-118n may be operated in substantially independent manners to thereby vary the temperatures of the airflows at different levels of the heat generating device 102.

Although each of the valves 118a-118n are illustrated as being positioned to control coolant flow into respective heat exchangers 116a-116n, one or more of the valves 118a-118n may be configured to control coolant flow into two or more of the heat exchangers 116a-116n without departing from a scope of the cooling device 110.

The coolant in the heat exchangers 116a-116n may absorb heat from the airflow passing by the heat exchangers 116a-116n. In absorbing heat from the airflow, the coolant may comprise chilled water or other suitable cooling fluids conventionally known to be used in cooling systems. In addition, or alternatively, the coolant may comprise cooling fluid configured to change phase, for instance, from a substantially liquid phase to a substantially gaseous phase. In this regard, the coolant may comprise any reasonably suitable cooling fluid.

In any respect, the coolant exits the heat exchangers 116a-116n and is cooled through heat exchange with a secondary heat exchanger 120, which in this case comprises a vapor-compression cycle. The secondary heat exchanger 120 generally includes a refrigeration loop formed with a refrigeration line 122 through which a refrigerant, for instance, R-134a, etc., flows. In operation, the coolant in the coolant line 112 is cooled through heat exchange with the refrigerant in an evaporator 124 positioned along the refrigerant line 122. Additionally, the refrigerant changes phase from a liquid to a gas as it travels through the evaporator 124 and absorbs heat from the coolant.

The heated refrigerant flows into a compressor 126, which compresses or pressurizes the refrigerant. The compressor 126 may comprise a variable capacity compressor or it may comprise a constant capacity compressor having a hot gas bypass (not shown). In any regard, the pressurized refrigerant then flows into a condenser 128 where some of the heat in the refrigerant is dissipated, for instance, into ambient air. Although not shown, the condenser 128 may include a fan to generally enhance heat dissipation from the refrigerant. The refrigerant then flows through an expansion valve 130 and back through the evaporator 124. This process may be substantially continuously repeated as needed to cool the coolant.

Although not shown, the secondary heat exchanger 120 may be configured to exchange heat from the coolant of at least one device-level cooling system (not shown) other than the cooling device 110 depicted in FIG. 1A. In this regard, the coolant line of the at least one other cooling system may also flow through the evaporator 124 to thereby exchange heat with the refrigerant contained in the evaporator 124.

The secondary heat exchanger 120 has been described in a relatively simplified manner. Therefore, it should be understood that the secondary heat exchanger 120 may include additional components without departing from a scope of the device-level cooling system 100. For instance, a three-way valve may be included to allow some of the refrigerant to bypass the compressor 126 and return into the evaporator 124. The three-way valve may be used, for instance, to divert some of the refrigerant exiting the evaporator 124 back into the refrigerant line 122 for re-entry into the evaporator 124 to generally ensure that the refrigerant is almost entirely in gaseous form prior to entering the compressor 126.

Alternatively, the secondary heat exchanger 120 may also comprise a chilled fluid loop connected to a refrigerated loop or another type of cooling loop. As such, the secondary heat exchanger 120 is not required to comprise a refrigerated loop, but may comprise other types of cooling loops without departing from a scope of the device-level cooling system 100 described herein.

The cooled coolant flows through the coolant line 112 from the evaporator 124 toward the heat exchangers 116a-116n through operation of the pump 114. The coolant may flow through an optional three-way valve 132 prior to flowing to reaching the heat exchangers 116a-116n. The optional three-way valve 132 may be employed, for instance, to divert some or all of the cooled coolant prior to the coolant reaching the heat exchangers 116a-116n. Some or all of the coolant may be diverted from the heat exchangers 116a-116n in situations where, for instance, the heat generating devices are operating at relatively low levels. In this regard, by re-circulating some or all of the cooled coolant back through the evaporator 124, the amount of work and therefore energy used by the secondary heat exchanger 120 may substantially be reduced when the heat generating devices are operating at the relatively low levels.

Figure 1B:
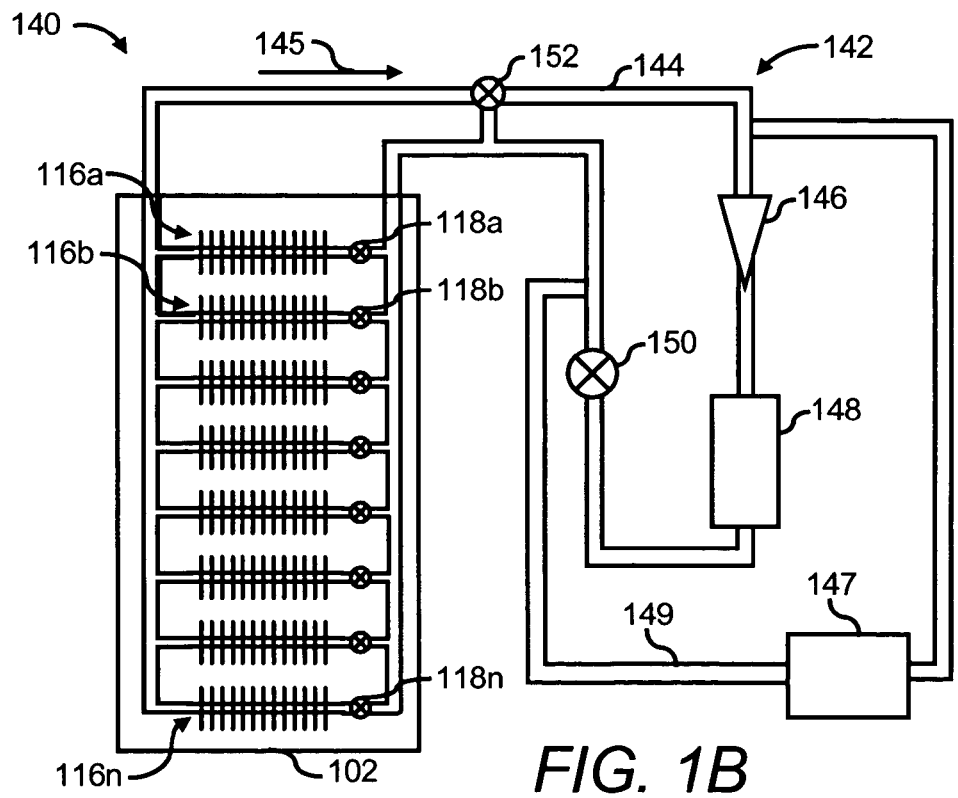
FIG. 1B shows a simplified schematic illustration of a device-level cooling system, according to another embodiment of the invention.

With reference now to FIG. 1B, there is shown a simplified schematic illustration of a device-level cooling system 140, according to a second example. It should be readily apparent to those of ordinary skill in the art that the device-level cooling system 140 depicted in FIG. 1B represents a generalized illustration and that other components may be added or existing components may be removed or modified without departing from a scope of the device-level cooling system 140. For example, the device-level cooling system 140 may include any number of heat exchangers, valves, and various other components.

The device-level cooling system 140 includes many of the same elements as the device-level cooling system 100 illustrated in FIG. 1A. The descriptions of the elements above with respect to the device-level cooling system 100 are applicable to the elements having the same reference numerals in the device-level cooling system 140. As such, those elements having the same reference numerals are not discussed in relatively great detail with respect to the device-level cooling system 140.

As shown, the device-level cooling system 140 includes a cooling device 142, which generally operates in similar manners to the cooling device 110. In contrast, however, the cooling device 142 includes a refrigerant line 144 through which a refrigerant flows and therefore does not include a secondary heat exchanger. Positioned along the refrigerant line 144 are a compressor 146, a condenser 148, and an expansion valve 150, along with the heat exchangers 116a-116n. In this regard, refrigerant that exits the heat exchangers 116a-116n flows toward the compressor 146 as generally indicated by the arrow 145.

Similarly to the compressor 126, the compressor 146 may comprise a variable capacity compressor or it may comprise a constant capacity compressor having a hot gas bypass valve 152. For instance, the hot gas bypass valve 152 may comprise a three-way valve operable to allow some of the refrigerant to bypass the compressor 146 and return into the heat exchangers 116a-116n. The three-way valve 152 may be used, for instance, to divert some of the refrigerant exiting the heat exchangers 116a-116n back into the refrigerant line 144 for re-entry into the heat exchangers 116a-116n to generally ensure that the refrigerant is almost entirely in gaseous form prior to entering the compressor 146.

In any regard, the pressurized refrigerant then flows into the condenser 148 where some of the heat in the refrigerant is dissipated, for instance, into ambient air. The condenser 148 may include a fan to generally enhance heat dissipation from the refrigerant. The refrigerant then flows through an expansion valve 150 and back through the heat exchangers 116a-116n. This process may be substantially continuously repeated as needed to cool the refrigerant.

The cooling device 142 has been described in a relatively simplified manner. Therefore, it should be understood that the cooling device 142 may include additional components without departing from a scope of the device-level cooling system 140. For instance, the refrigerant line 144 of the cooling device 142 may be configured to supply and receive refrigerant from heat exchangers (denoted by the block 147) positioned to cool airflow around other heat generating devices (not shown). In this example, some of the refrigerant flowing from the expansion valve 150 may be supplied to the heat exchangers 147 through another refrigerant line 149, as shown in FIG. 1B. In addition, refrigerant exiting from the heat exchangers 147 may be supplied through the compressor 146, the condenser 148, and expansion valve 150 for re-cooling.

Figure 1C:
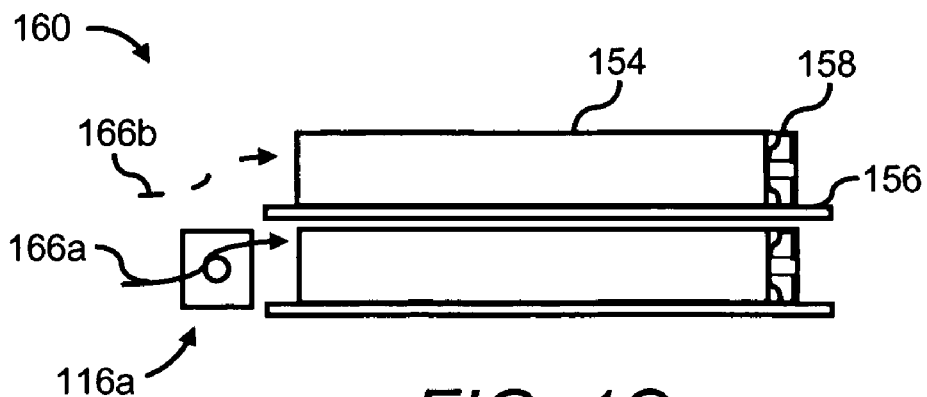
FIGS. 1C-1E depict respective side views, partially in cross section, of three positions at which heat exchangers may be positioned with respect to components in the cooling systems depicted in FIGS. 1A and 1B, according to embodiments of the invention.
Figure 1D:
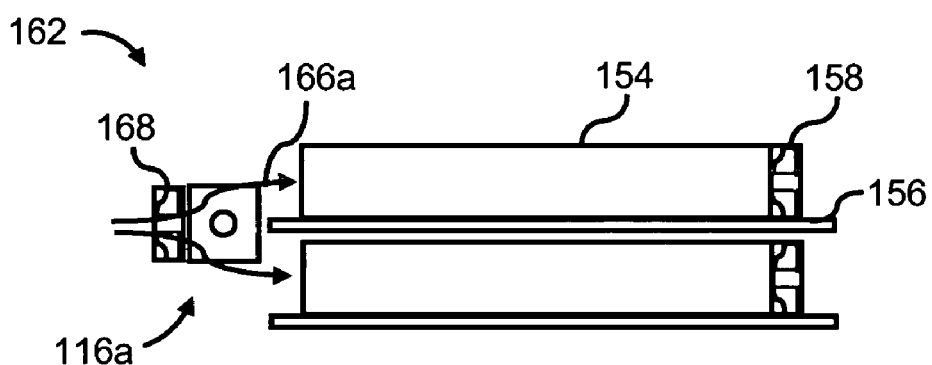
Figure 1E:
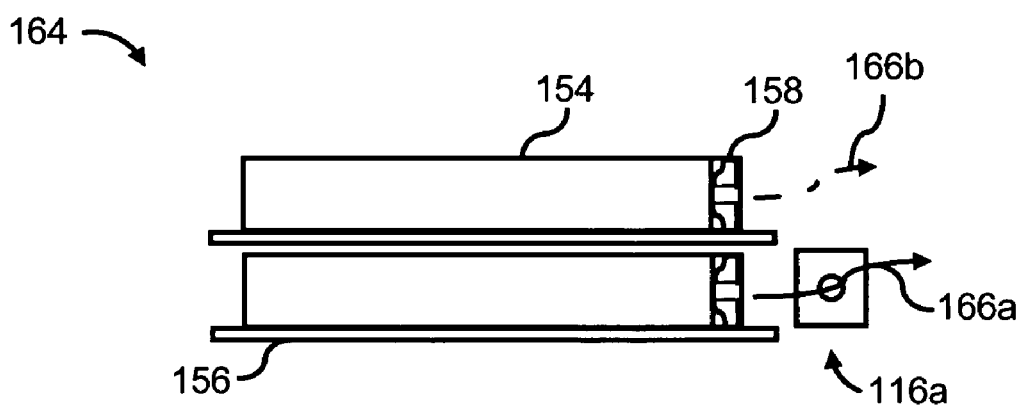

FIGS. 1C-1E depict respective side views 160-164, partially in cross section, of three positions at which the heat exchangers 116a-116n (only heat exchanger 116a is shown) may be positioned with respect to components 154 in the heat generating device 102. The components 154 are illustrated as being positioned on respective supports 156 of the heat generating device 102. The side views 160-164 are provided to illustrate examples of various heat exchanger 116a positions, but it should be understood that other configurations of the heat exchanger 116a and the components 154 may be employed without departing from a scope of the device-level cooling systems 100 and 140. For instance, with respect to the side views 160 and 162 depicted in FIGS. 1C and 1D, another heat exchanger 116n may be positioned above the heat exchanger 116a, on the opposite side of a component 154, etc. As another example with respect to the side view 164 depicted in FIG. 1E, another heat exchanger 116n may be positioned at an inlet of a component 154, a fan may be included with the heat exchanger 116a, etc.

As shown in FIGS. 1C-1E, airflow that flows either into or out of the components 154 are indicated by the arrows 166a and 166b. More particularly, the arrows 166a indicate airflows that pass through or otherwise transfer heat with the heat exchanger 116a and the airflows that do not pass through or otherwise transfer little or no heat with the heat exchanger 116a are denoted by the arrows 166b. In addition, the airflows may be assisted in flowing through the components 154 through operation of fans 158. The fans 158 may comprise fans that are integrally formed with the components 154. The positions of the fans 158 depicted in FIGS. 1C-1E are for illustrative purposes only and are thus not meant to limit the components 154 in any respect. The airflows through the components 154 may also be assisted through operation of one or more fans 168 positioned to increase airflow through the heat exchanger 116a, as shown in FIG. 1D.

The fans 168 may be provided on some or all of the heat exchangers 116a-116n and may span multiple heat exchangers 116a-116n. In addition, the fans 168 may be removably attached to the heat exchangers 116a-116n such that the fans 168 may be attached to and removed the heat exchangers 116a-116n as needed or desired. Alternatively, however, the fans 168 may be substantially permanently attached to the heat exchangers 116a-116n without departing from a scope of the heat exchangers 116a-116n.

Figure 1F:
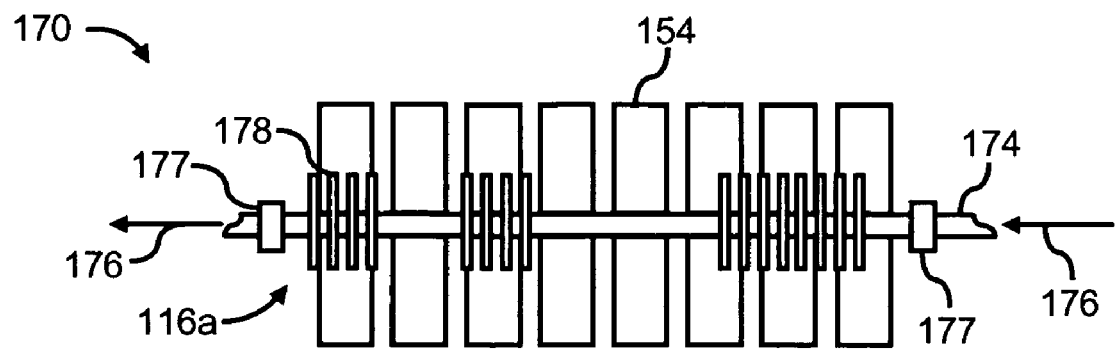
FIGS. 1F and 1G depict views of two possible positions at which heat exchangers may be positioned with respect to components in the cooling systems in FIGS. 1A and 1B, according to embodiments of the invention.
Figure 1G:
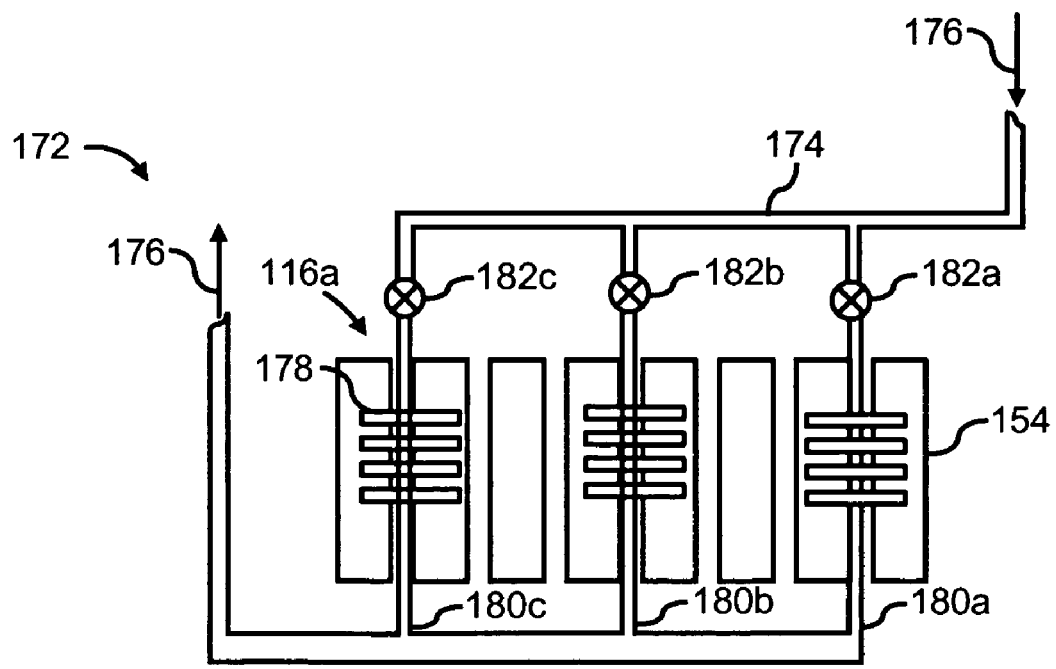

FIGS. 1F and 1G depict views 170 and 172, of two possible positions at which the heat exchangers 116a-116n (only heat exchanger 116a is shown) may be positioned with respect to components 154. The views 170 and 172 may depict either or both of the front and rear views. In this regard, the views 170 and 172 may represent either or both of the inlets and outlets of the components 154. It should be understood that the views 170 and 172 are merely representative of possible configurations of the heat exchanger 116a and that other configurations are possible within the scope of the device-level cooling systems 100 and 140.

As shown in FIG. 1F, the heat exchanger 116a includes a fluid line 174 through which either a coolant or a refrigerant flows. In this respect, the fluid line 174 may comprise either the coolant line 112 or the refrigerant line 144. In addition, the coolant or refrigerant is configured to flow through the heat exchanger 116a as depicted by the arrows 176. Positioned along the fluid line 174 are a plurality of fins 178. The fins 178 may be positioned as shown to enable greater heat removal from airflow supplied to or exhausted from particular ones of the components 154. Greater heat removal may be enabled for those components 154 that generate greater amounts of heat. In addition, the fins 178 may be spaced apart from each other to provide spaces of greater airflow for or from those components 154 that may generate lesser amounts of heat. In this regard, for instance, the heat exchanger 116a may be configured in various respects to generally enable a relatively high level of customization in cooling airflows supplied into or exhausted from the components 154.

Also shown in FIG. 1F are optional couplings 177 that generally enable the heat exchanger 116a to be removably attached to the fluid line 174. The optional couplings 177 may comprise any reasonably suitable coupling that enables a fluid line, such as a tube, conduit, etc., to be removably attached to another fluid line. The optional couplings 177 may also comprise features that enable the fluid line 174 to be closed when the heat exchanger 116a is removed or that enable the fluid line 174 to be manually opened and closed.

Generally speaking, the optional couplings 177 may be provided to enable greater flexibility in the positioning of the heat exchangers 116a-116n. Thus, for instance, through use of the optional couplings 177, heat exchangers 116a-116n may be positioned along the fluid line 174 as needed or desired with changes in the positions or thermal characteristics of the components 154.

Referring now to FIG. 1G, the fluid line 174 is arranged to provide varying amounts of coolant or refrigerant to respective components 154. More particularly, the fluid line 174 in FIG. 1G is separated into a plurality of sub-lines 180a-180c arranged in parallel with respect to each other. In addition, each of the sub-lines 180a-180c includes a respective valve 182a-182c configured to control the flow of through the sub-lines 180a-180c. In this regard, the amount of coolant or refrigerant supplied with respect to various components 154 may be controlled. As such, for instance, the coolant or refrigerant flow may substantially be controlled to substantially minimize energy usage in cooling the airflow supplied to or exhausted from the components 154.

Figure 2:
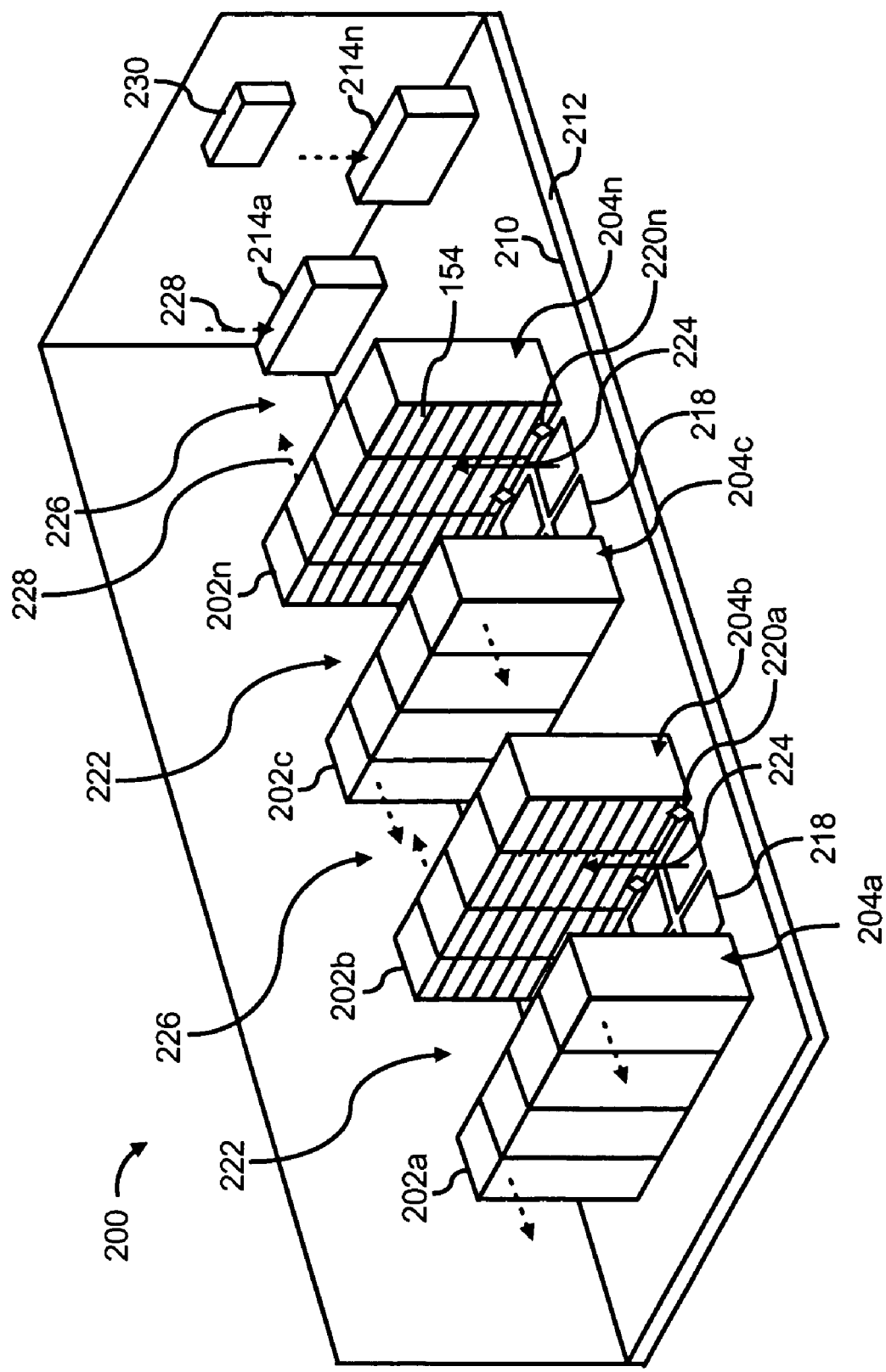
FIG. 2 shows a simplified perspective view of a room according to an embodiment of the invention.

The device-level cooling systems 100 and 140 may be positioned with respect to one or more heat generating devices 102 contained in a room, such as, a data center environment, as shown, instance in FIG. 2. More particularly, FIG. 2 shows a simplified perspective view of a section of a room 200 in which one or both of the device-level cooling systems 100 and 140 may be implemented. As shown in FIG. 2, the heat generating devices 102 may comprise electronics cabinets or racks 202a-202n housing heat generating components 154, where "n" is an integer equal to or greater than one. As such, one or more of the racks 202a-202n may comprise the configuration of the heat generating device 102 and may include one or both of the device-level cooling systems 100 and 140.

The racks 202a-202n are illustrated as being aligned in parallel rows and positioned on a raised floor 210. It should however, be understood that the racks 202a-202n may be arranged in any reasonably suitable configuration and that the racks 202a-202n do not have to be positioned on a raised floor 210. In this regard, for instance, the racks 202a-202n may be positioned in a conventional computer room, such as a data center, or any other reasonably suitable room. The following description of the room 200, however, is directed to a data center environment having a raised floor for purposes of illustration.

The racks 202a-202n are generally configured to house a plurality of components 154 capable of generating/dissipating heat, for instance, processors, micro-controllers, high-speed video cards, memories, semi-conductor devices, and the like. The components 154 may be elements of a plurality of subsystems (not shown), for instance, computers, servers, bladed servers, etc. The subsystems and the components may be operated to perform various electronic functions, for instance, computing, switching, routing, displaying, and the like. A plurality of wires and communication lines (not shown) may be located in a space 212 beneath the raised floor 210. The space 212 may also function as a plenum for delivery of cooled air from one or more actuators.

Also shown in FIG. 2 are air conditioning (AC) units 214a-214n, where "n" is an integer equal to or greater than one. The AC units 214a-214n are generally configured to manipulate a characteristic of the cooled airflow supplied to the racks 202a-202n through actuation of one or more actuators. The actuators may include a device for controlling airflow temperature and a device for controlling the flow rates at which the cooled air is supplied.

The cooled air may be delivered from the space 212 to the racks 202a-202n through vent tiles 218 located between some or all of the racks 202a-202n. The vent tiles 218 may comprise manually or remotely adjustable vent tiles. In this regard, the vent tiles 218 may be manipulated to vary, for instance, the mass flow rates of cooled air supplied to the racks 202a-202n. In addition, the vent tiles 218 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104, the vent tiles 218 are termed "dynamically controllable" because they generally operate to control at least one of velocity, volume flow rate and direction of the cooled airflow therethrough. In addition, specific examples of dynamically controllable vent tiles 218 may be found in U.S. Pat. No. 6,694,759, filed on Jan. 27, 2003, which is assigned to the assignee of the present invention and is incorporated by reference herein in its entirety.

The cooled air contained in the space 212 may include cooled air supplied by one or more AC units 214a-214n. Thus, characteristics of the cooled air, such as, temperature, pressure, humidity, flow rate, etc., may substantially be affected by the operations of one or more of the AC units 214a-214n. In this regard, characteristics of the cooled air at various areas in the space 212 and the cooled air supplied to the racks 202a-202n may vary, for instance, due to mixing of the cooled air. In other words, the characteristics of the cooled air supplied to a particular location in the data center 200 may differ from that of the cooled air supplied by a single AC unit 214a.

At least one condition, for instance, temperature, pressure, or humidity, of the cooled air supplied to various areas of the data center 200 may be detected by sensors 220a-220n, where "n" is an integer equal to or greater than one. As shown, the sensors 220a-220n are represented as diamonds to distinguish them from other elements depicted in FIG. 2. In addition, the sensors 220a-220n are depicted as being positioned to detect the at least one condition at the inlets of the racks 202a-202n. In this example, the sensors 220a-220n may comprise temperature sensors or absolute humidity sensors. In another example, the sensors 220a-220n may be positioned within the space 212 near respective vent tiles 218 to detect the temperature, pressure, or humidity of the cooled air supplied through the respective vent tiles 218. Thus, although the sensors 220a-220n are depicted as being located on the raised floor 210, the sensors 220a-220n may be positioned at various other reasonably suitable locations, including, for example, near or within some or all of the components 154. The sensors 220a-220n may also form part of the heat exchangers 116a-116n, for instance, on exhaust sides of the heat exchangers 116a-116n.

The areas between the rows labeled as 204a and 204b and between the rows labeled as 204c and 204n may comprise cool aisles 222. These aisles are considered "cool aisles" because they are configured to receive cooled airflow from the vent tiles 218, as generally indicated by the arrows 224. In addition, and as shown, the racks 202a-202n generally receive cooled air from the cool aisles 222. The aisles between the rows labeled as 204b and 204c, and on the rear sides of rows 204a and 204n, are considered hot aisles 226. These aisles are considered "hot aisles" because they are positioned to receive air that has been heated by the components 154 in the racks 202a-202n, as indicated by the arrows 228.

Although not shown, some or all of the racks 202a-202n may be positioned to each face the same direction, such that there are no distinct "hot aisles" and "cool aisles". Additionally, some or all of the racks 202a-202n may be positioned with their rear sides adjacent to one another. In this example, the vent tiles 218 may be provided in each aisle 222 and 226. In addition, the racks 202a-202n may comprise outlets on top panels thereof to enable heated air to flow out of the racks 202a-202n.

As described herein above, the AC units 214a-214n generally operate to cool heated air (arrows 228) received into the AC units 214a-214n. In addition, the AC units 214a-214n may supply the racks 202a-202n with airflow that has been cooled, through any reasonably suitable known manners and may thus comprise widely available, conventional AC units. For instance, the AC units 214a-214n may comprise vapor-compression type air conditioning units, chilled water air conditioning units, etc. Examples of suitable AC units 214a-214n may be found in co-pending and commonly assigned U.S. patent application Ser. No. 10/853, 529, filed on May 26, 2004, and entitled "Energy Efficient AC Unit Operation," the disclosure of which is hereby incorporated by reference in its entirety.

One or more of the racks 202a-202n may include a cooling system 100, 140 positioned to either cool airflow supplied into the one or more racks 202a-202n or to cool airflow exhausted from the one or more racks 202a-202n. In this regard, the cooling systems 100, 140 positioned with respect to the one or more racks 202a-202n may operate to supplement the cooling provided by the AC units 214a-214n. By way of example, the supplemental cooling may be provided to cool airflow delivered to or exhausted from those racks 202a-202n that dissipate comparatively large amounts of heat. As another example, the supplemental cooling may be provided to cool airflow exhausted from racks 202a-202n known to contribute to adverse re-circulation of heated airflow into cooling airflow supplied into the racks 202a-202n.

Also shown in FIG. 2 is a resource manager 230 configured to perform various functions in the data center 200. The resource manager 230 may operate the AC units 214a-214n and the device-level cooling systems 100, 140 based upon received information as described in greater detail herein below. The resource manager 230 may also operate other elements in the data center 200, including, for instance, controllable vent tiles 218.

Although the resource manager 230 is illustrated in FIG. 2 as comprising a component separate from the components 154 housed in the racks 202a-202n, the resource manager 230 may comprise one or more of the components 154 without departing from a scope of the data center 200 disclosed herein. In addition, or alternatively, the resource manager 230 may comprise software configured to operate on a computing device, for instance, one of the components 154.

Figure 3A:
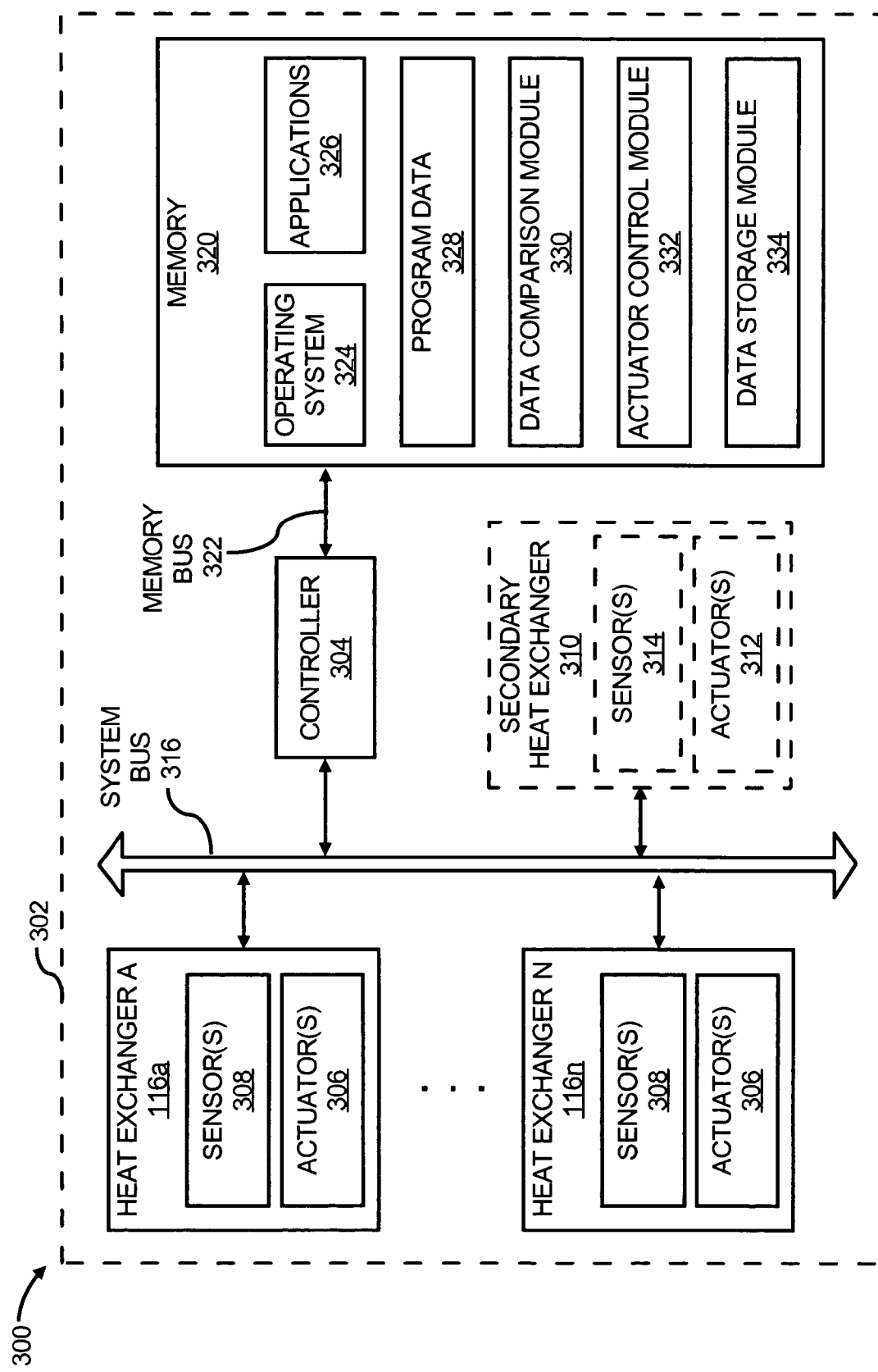
FIG. 3A shows a block diagram of a cooling control system for controlling the airflow around one or more heat generating devices, according to an embodiment of the invention.

With reference now to FIG. 3A, there is shown a block diagram 300 of a cooling control system 302 for controlling the airflow around one or more heat generating devices 102, 202a-202n. It should be understood that the following description of the block diagram 300 is but one manner of a variety of different manners in which such a cooling control system 302 may be operated. In addition, it should be understood that the cooling control system 302 may include additional components and that some of the components described may be removed and/or modified without departing from a scope of the cooling control system 302.

The cooling control system 302 may be implemented to control the device-level cooling systems 100 and 140 depicted in FIGS. 1A and 1B. In addition, however, the cooling control system 302 may be implemented to control cooling systems having configurations that differ from the device-level cooling systems 100 and 150 without departing from a scope of the cooling control system 302. In this regard, references to the device-level cooling systems 100 and 140 are for illustrative and simplicity of description purposes and are not to be construed as limiting the cooling control system 302.

As shown in FIG. 3A, the cooling control system 302 includes a controller 304 configured to control various operations of the cooling control system 302. The controller 304 may comprise a computing device, for instance, a computer system, a server, a proportional, integral, derivative (PID) control system, etc. In addition, the controller 304 may comprise a microprocessor, a micro-controller, an application specific integrated circuit (ASIC), and the like, configured to perform various processing functions. In addition, or alternatively, the controller 304 may comprise software operating in any of a number of computing devices.

Generally speaking, the controller 304 is configured to control one or both of temperatures of airflow supplied to or exhausted from various components 154 located in one or more heat generating devices 102, 202a-202n. In other words, the controller 304 may control one or both of the temperature of airflow supplied to or exhausted from components 154 located in the same heat generating device 202a, or in different heat generating devices 202a-202n. In controlling these temperatures, the controller 304 is configured to control one or more actuators 306 associated with heat exchangers 116a-116n positioned with respect to one or more heat generating devices 102, 202a-202n. For example, the controller 304 may control the rate at which cooling fluid is supplied through each of heat exchangers 116a-116n. In this instance, the actuators 306 may comprise the valves 118a-118n. In addition, or alternatively, the controller 304 may control the amount of airflow passing through or otherwise transferring heat with the heat exchangers 116a-116n. In this instance, the actuators 306 may comprise one or more of the fans 168. In addition, the fans 168 may be controlled based upon static or differential air pressure measurements. For instance, the speeds of the fans 168 may be modified according to, for instance, static pressure build up between a heat exchanger 116a and a component 154.

The controller 304 may also receive information from one or more sensors 308 associated, for instance, with control of the heat exchangers 116a-116n. The sensors 308 may comprise sensors configured to detect the temperatures of the components 154, sensors to detect the temperatures or statuses of the cooling fluid exiting the heat exchangers 116a-116n, etc. The controller 304 may utilize the temperature information to determine the rates at which cooling fluid is supplied through each of the heat exchangers 116a-116n. The controller 304 may also utilize the temperature information to control operations of the fans 168, for instance, for those heat exchangers 116a-116n equipped with fans 168.

In another example, the sensors 308 may comprise sensors configured to detect mass airflow rates through the components 154. In this example, the sensors 308 may comprise anemometers, pressure sensors, etc. In addition, the controller 304 may utilize information from these sensors 308 to determine whether the fans 168 should be activated, and in certain situations, the levels to which the fans 168 are operated. The controller 304 may also utilize the mass flow rate information to control the amount of cooling fluid supplied through the heat exchangers 116a-116n.

In certain situations, the controller 304 may control operations of a secondary heat exchanger 310 configured to cool the cooling fluid supplied through the heat exchangers 116a-116n. The controller 304 may, for instance, be configured to control one or more actuators 312 of the secondary heat exchanger 310 to vary the amount of amount of heat extracted from the cooling fluid and thus the temperature of the cooling fluid. The amount of heat extracted from the cooling fluid may be varied to thereby vary the amount of energy used to cool the cooling fluid. Thus, for instance, operations of the secondary heat exchanger 310 may be varied to substantially minimize the amount of energy used in cooling the cooling fluid.

The secondary heat exchanger 310 is depicted in dashed lines because the secondary heat exchanger 310 may, in other instances, be controlled by a controller different from the controller 304, or the heat exchanger 310 may be manually controlled. In any event, the secondary heat exchanger 310 may include at least one actuator 312 and at least one sensor 314. The at least one sensor 314 may be configured to detect the temperature of the cooling fluid and the at least one actuator 312 may be manipulated in response to the detected temperature. In one respect, the at least one actuator 312 may comprise a variable capacity compressor that may be configured to vary the level of compression applied to a refrigerant to thereby vary the temperature of the refrigerant.

Thus, for instance, with respect to FIG. 1A, if the compressor 126 comprises a variable capacity compressor, the controller 304 may vary operations of the compressor 126 to thereby vary the amount of energy consumed by the secondary heat exchanger 120 in cooling the coolant flowing in the coolant line 112. As another example, with respect to FIG. 1B, if the compressor 146 comprises a variable capacity compressor, the controller 304 may operate the compressor 146 to vary compression levels on the refrigerant flowing through the refrigerant line 144.

Communications between the controller 304, the heat exchangers 116a-116n, and optionally, the secondary heat exchanger 310, may be effectuated through a system bus 316. The system bus 316 represents any of several types of bus structures, including, for instance, a memory bus, a memory controller, a peripheral bus, an accelerated graphics port, a processor bus using any of a variety of bus architectures, and the like.

The controller 304 is also illustrated as being in communication with a memory 320 through, for instance, a memory bus 322. However, in certain instances, the memory 320 may form part of the controller 304 without departing from a scope of the cooling control system 302. Generally speaking, the memory 320 may be configured to provide storage of software, algorithms, and the like, that provide the functionality of the controller 304. By way of example, the memory 320 may store an operating system 324, application programs 326, program data 328, and the like. In this regard, the memory 320 may be implemented as a combination of volatile and non-volatile memory, such as DRAM, EEPROM, MRAM, flash memory, and the like. In addition, or alternatively, the memory 320 may comprise a device configured to read from and write to a removable media, such as, a floppy disk, a CD-ROM, a DVD-ROM, or other media.

The memory 320 may also store modules programmed to perform various cooling control system 302 functions. More particularly, the memory 320 may store a data comparison module 330, an actuator control module 332, and a data storage module 334. Generally speaking, the controller 304 may implement the modules 330-334 to control one or both of temperatures of airflow supplied to or exhausted from various components 154 located in one or more of the heat generating devices 102, 202a-202n.

The controller 304 may implement the data comparison module 330 to compare condition information received from the sensors 308 associated with the heat exchangers 116a-116n with predefined condition ranges. In situations where the controller 304 is configured to control the secondary heat exchanger 310, the data comparison module 330 may also be implemented to compare condition information received from the sensors 314 associated with the secondary heat exchangers 310. As described in greater detail herein below with respect to FIG. 4, the types of comparisons performed by the controller 304 may vary depending upon the types of condition information the controller 304 receives.

The controller 304 may implement the actuator control module 332 to control one or more of the actuators 306, 312 based upon comparisons between the received condition data and the predefined condition ranges. More particularly, for instance, when a difference between the received condition data and the predefined condition ranges is determined, the controller 304 may implement the actuator control module 332 to send control signals to the appropriate actuators 306, 312 to bring the detected conditions within the predefined condition ranges.

The controller 304 may implement the data storage module 334 to store information pertaining to, for instance, the locations of the heat exchangers 116a-116n, the association between the valves 118a-118n to the heat exchangers 116a-116n, associations between the heat exchangers 116a-116n and the secondary heat exchanger 310, etc. The controller 304 may additionally implement the data storage module 334 to store information pertaining to changes detected due to varying the actuators 306, 312. Thus, for instance, the controller 304 may implement the data storage module 334 as a reference to determine how one or more of the actuators 306, 312 are to be manipulated to achieve a desired result.

As may be seen from the discussion above, the cooling control system 302 may be employed to control cooling at the heat generating device 202a-202n level. As such, the cooling control system 302 may be configured to control cooling around one or more heat generating devices 202a-202n in a substantially independent manner from, for instance, cooling systems configured to cool the room in which the one or more heat generating devices 202a-202n are located. In one regard, the cooling control system 302 may thus be employed to provide supplemental cooling to airflow around those heat generating devices 202a-202n having relatively large power densities, in a manner that is substantially independent from operations of the room level cooling systems, such as, the AC units 214a-214n and the vent tiles 218.

Figure 3B:
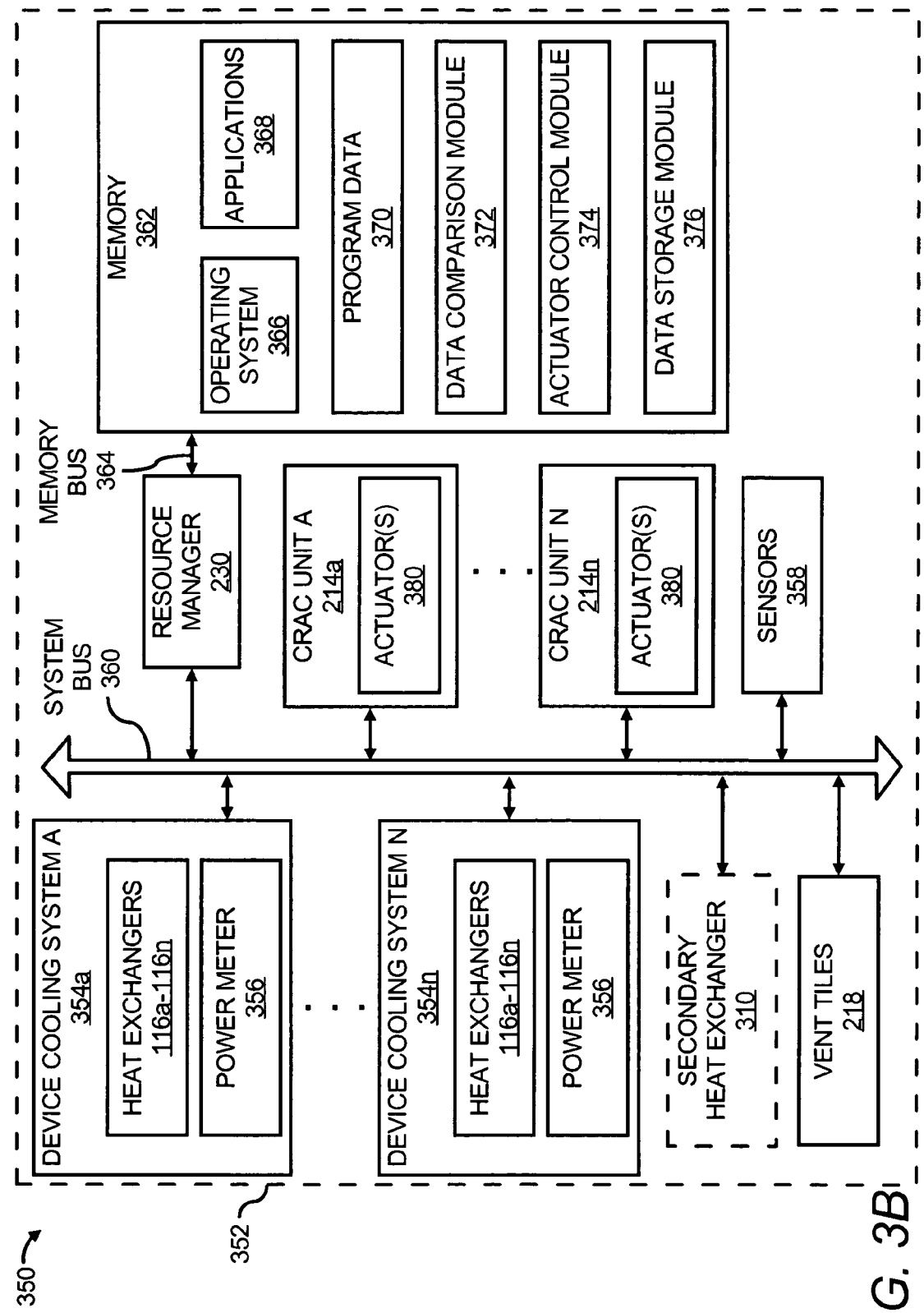
FIG. 3B shows a block diagram of a global cooling control system for cooling a room, according to an embodiment of the invention.

The heat exchangers 116a-116n may, however, also be operated as part of the room level or global cooling systems as discussed with respect to FIG. 3B. More particularly, FIG. 3B shows a block diagram 350 of a global cooling control system 352 for cooling a data center 200. It should be understood that the following description of the block diagram 350 is but one manner of a variety of different manners in which such a global cooling control system 352 may be operated. In addition, it should be understood that the global cooling control system 352 may include additional components and that some of the components described may be removed and/or modified without departing from a scope of the global cooling control system 352.

The global cooling control system 352 is generally configured to control cooling provisioning in the room 200. In this regard, the global cooling control system 352 is configured to control one or more of the AC units 214a-214n, the vent tiles 218, and device-level cooling systems 354a-354n. Each of the device-level cooling systems 354a-354n includes one of the device-level cooling systems 100, 140, and thus the heat exchangers 116a-116n. The device-level cooling systems 354a-354n may also include a secondary heat exchanger 310 configured to cool the cooling fluid contained in the device-level cooling systems 354a-354n. As such, in one regard, the heat exchangers 116a-116n may be employed to one or both of provide supplemental cooling to and cool airflow exhausted from those racks 202a-202n equipped with the device-level cooling systems 354a-354n.

In controlling cooling provisioning in the room 200, the resource manager 230 is configured to control one or more actuators 306 associated with heat exchangers 116a-116n positioned with respect to one or more racks 202a-202n, as described herein above with respect to the controller 304 depicted in FIG. 3A. In this regard, for instance, the resource manager 230 may control one or more of the actuators 306 of the heat exchangers 116a-116n as described with respect to cooling control system 302. The resource manager 230 may also control the secondary heat exchanger 310, as also described above. The secondary heat exchanger 310 may, however, be controlled by another controller (not shown) or the secondary heat exchanger 310 may be manually controlled.

In addition, or alternatively, the resource manager 230 may control the heat exchangers 116a-116n and the secondary heat exchanger 310 through transmission of instructions to the controller 304. In this case, instead of direct control over the actuators 306 of the heat exchangers 116a-116n and the actuator 312 of the secondary heat exchanger 310, the resource manager 230 may convey instructions through the controller 304. The following description of the global cooling control system 352 will be described with reference to the resource manager 230 having direct control over the actuators 306 and 312 for simplicity of description purposes. It should, therefore, be understood that control over the actuators 306, 312 may be effectuated through operation of the controller 304 without departing from a scope of the global cooling control system 352 described herein.

The resource manager 230 may comprise a computing device, for instance, a computer system, a server, a proportional, integral, derivative (PID) control system, etc. In addition, the resource manager 230 may comprise a microprocessor, a micro-controller, an application specific integrated circuit (ASIC), and the like, configured to perform various processing functions. In addition, or alternatively, the resource manager 230 may comprise software operating in any of a number of computing devices.

The resource manager 230 may also receive information pertaining to the power consumption levels of the device-level cooling systems 354a-354n. In this regard, for instance, the device-cooling systems 354a-354n may include power meters 356 configured to detect the amount of power consumed by the device-level cooling systems 354a-354n. The power consumption levels of the device-level cooling systems 354a-354n may alternatively be calculated based upon, for instance, the amount of work the secondary heat exchanger 310 performs in cooling the cooling fluid flowing through the respective heat exchangers 116a-116n. In this case, the amount of work performed by the secondary heat exchanger 310 may be correlated to the amount of power consumed by the device-level cooling systems 354a-354n. This correlation may be determined through testing or based upon manufacturer guidelines.

As shown in FIG. 3B, the resource manager 230 may receive condition information detected by the sensors 308 associated with the heat exchangers 116a-116n of the heat generating devices 202a-202n as described hereinabove. The resource manager 230 may also receive information from sensors 358 positioned at various locations in the room 200. In a first example, the sensors 358 may comprise sensors configured to detect the temperature of airflow returned into the AC units 214a-214n. As described in greater detail herein below, the resource manager 230 may employ the return air temperature in controlling the AC units 214a-214n. In a second example, the sensors 358 may comprise meters configured to detect the power consumption levels of the AC units 214a-214n. The power consumption levels of the AC units 214a-214n may, however, be calculated based upon, for instance, the operating levels of the AC units 214a-214n.

Communications between the resource manager 230 and the device-level cooling systems 354a-354n, the AC units 214a-214n, the sensors 358, and optionally, the secondary heat exchanger 310, may be effectuated through a system bus 360. The system bus 360 represents any of several types of bus structures, including, for instance, a memory bus, a memory controller, a peripheral bus, an accelerated graphics port, a processor bus using any of a variety of bus architectures, and the like. The system bus 360 may also comprise a network to which the devices listed above are attached.

The resource manager 230 is also illustrated as being in communication with a memory 362 through, for instance, a memory bus 364. However, in certain instances, the memory 362 may form part of the resource manager 230 without departing from a scope of the global cooling control system 352. The memory 362 generally provides storage of software, algorithms, and the like, that provide the functionality of the resource manager 230. By way of example, the memory 362 may store an operating system 366, application programs 368, program data 370, and the like. In this regard, the memory 362 may be implemented as a combination of volatile and non-volatile memory, such as DRAM, EEPROM, MRAM, flash memory, and the like. In addition, or alternatively, the memory 362 may comprise a device configured to read from and write to a removable media, such as, a floppy disk, a CD-ROM, a DVD-ROM, or other media.

The memory 362 may also store modules programmed to perform various global cooling control system 352 functions. More particularly, the memory 362 may store a data comparison module 372, an actuator control module 374, and a data storage module 376. Generally speaking, the resource manager 230 may implement the modules 372-376 to control cooling in the room 200.

The resource manager 230 may implement the data comparison module 372 to compare condition information received from the sensors 308 associated with the heat exchangers 116a-116n with predefined condition ranges, as described above with respect to the data comparison module 330. In addition, the types of comparisons performed by the resource manager 230 may vary depending upon the types of condition information the resource manager receives, as described in greater detail herein below with respect to FIG. 4.

The resource manager 230 may also implement the data comparison module 372 to perform various other functions with respect to the device-level cooling systems 354a-354n and the AC units 214a-214n. In a first example, the resource manager 230 may implement the data comparison module 372 to compare condition information received from the sensors 358 with predefined condition ranges. In this example, the temperature of the airflow returned into the AC units 214a-214n may be compared to predefined operating temperatures.

In a second example, the resource manager 230 may implement the data comparison module 372 to compare energy consumption levels in operating the device-level cooling systems 354a-354n and the AC units 214a-214n at various levels. In a third example, the resource manager 230 may implement the data comparison module 372 to determine whether there are areas on the room 200 where adverse re-circulation of heated airflow is occurring, through, for instance, temperatures detected by the sensors 308.

The resource manager 230 may implement the actuator control module 374 to control one or more of the actuators 306, 312 based upon comparisons between the received condition data and the predefined condition ranges, as described above with respect to the actuator control module 332. The resource manager 230 may also implement the actuator control module 374 to control one or more AC unit actuators 380 when a difference between the received temperatures and the predefined temperature range is determined. The AC unit actuators 380 may include, for instance, variable frequency drives (VFD) or other suitable mechanisms for controlling an airflow volume varying device, such as a blower or fan. The AC unit actuators 380 may also comprise devices for controlling the temperature of the cooled air supplied by the AC units 214a-214n.

According to the second example above, the resource manager 230 may implement the actuator control module 374 to control one or more of the actuators 306, 312, 380 in accordance with a scheme designed to substantially minimize energy consumption of the device-level cooling systems 354a-354n and the AC units 214a-214n. Thus, for instance, the resource manager 230 may increase operations of one or more of the device-level cooling systems 354a-354n or one or more of the AC units 214a-214n in response to an increase in cooling demand, depending upon which action requires the least amount of energy.

According to the third example above, the resource manager 230 may implement the actuator control module 374 to control one or more of the actuators 306, 312 to substantially minimize adverse effects of heated airflow re-circulation in the room 200. More particularly, for instance, the resource manager 230 may increase the cooling provided by the device-level cooling systems 354a-354n from which heated airflow is exhausted and re-circulated into an airflow supplied into a heat generating device 202a. As such, the temperature of the re-circulated airflow may substantially be reduced to thereby reduce the adverse effects of the airflow re-circulation.

The resource manager 230 may implement the data storage module 376 to store information pertaining to, for instance, the locations of the heat exchangers 116a-116n, the association between the valves 118a-118n to the heat exchangers 116a-116n, associations between the heat exchangers 116a-116n and the secondary heat exchanger 310, the locations of the AC units 214a-214n, the locations of the sensors 358, etc. The resource manager 230 may additionally implement the data storage module 376 to store information pertaining to changes detected due to varying the actuators 306, 312, 380. Thus, for instance, the resource manager 230 may implement the data storage module 376 as a reference to determine how one or more of the actuators 306, 312, 380 are to be manipulated to achieve a desired result.

As may be seen from the discussion above, the global cooling control system 352 may be employed to control cooling at the both the heat generating device 202a-202n and the room 200 levels. As such, the global cooling control system 352 may be configured to control cooling around one or more heat generating devices 202a-202n substantially in conjunction with the AC units 214a-214n. In one regard, the global cooling control system 352 may be employed to control supplemental cooling to airflow around those heat generating devices 202a-202n having relatively large power densities. In addition, the global cooling control system 352 may be employed to implement the device-level cooling systems 354a-354n and the AC units 214a-214n in manners designed to achieve energy efficient cooling of heat generating components 154 in the room 200.

Figure 4:
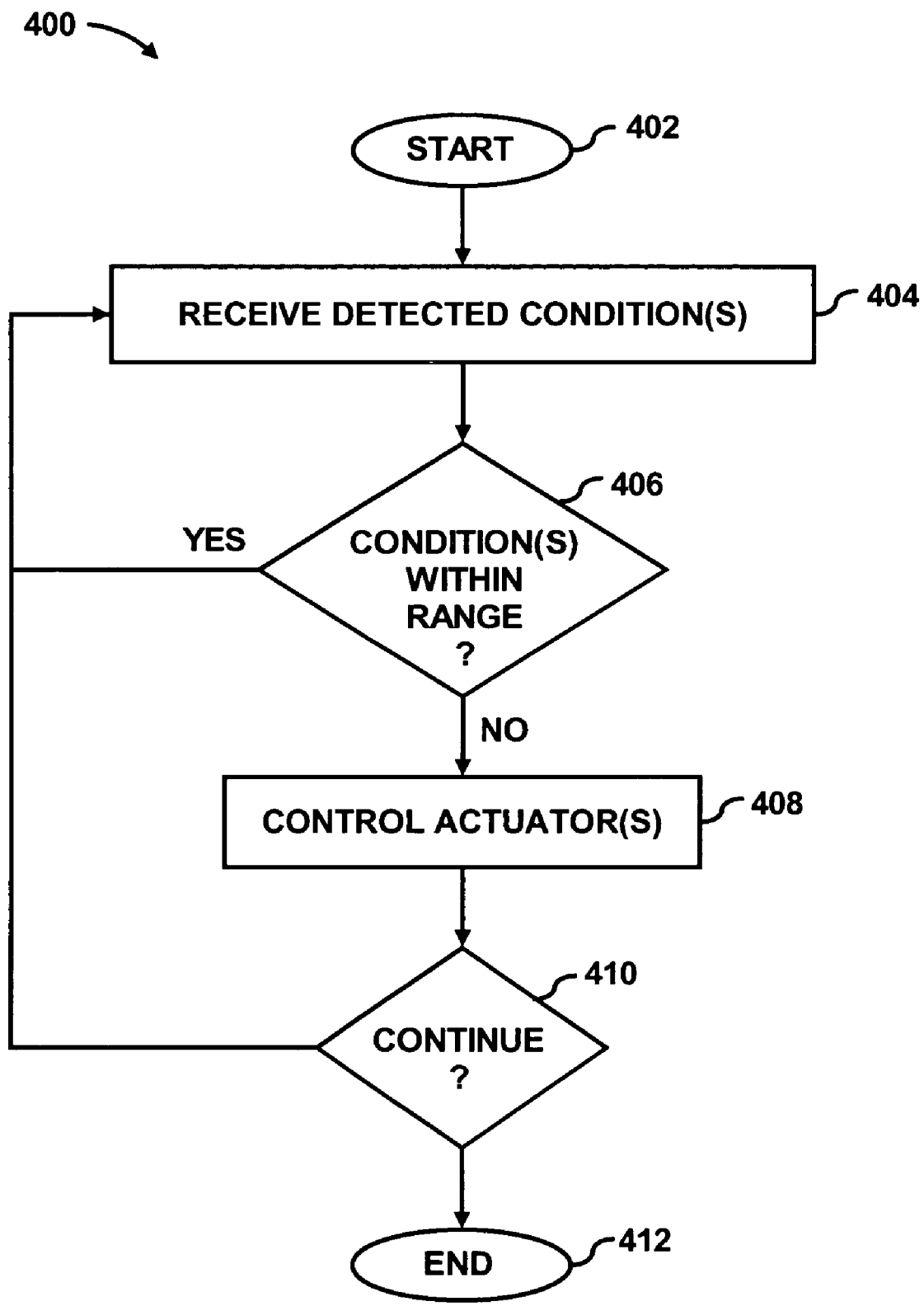
FIG. 4 shows a flow diagram of a method for controlling the airflow around one or more heat generating devices, according to an embodiment of the invention.

With particular reference now to FIG. 4, there is shown a flow diagram of a method 400 for controlling the airflow around one or more heat generating devices 102, 202a-202n, according to an example. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400. Although particular references to the elements shown in FIGS. 3A and 3B are made in the description of the method 400, it should be understood that the method 400 is not limited to being implemented by the elements shown in FIGS. 3A and 3B and may be implemented by more, less, or different elements as those shown in FIGS. 3A and 3B.

Generally speaking, the method 400 may be implemented to substantially control airflow around the heat generating devices 102, 202a-202n. More particularly, for instance, the method 400 may be implemented to substantially control at least one of the temperature and the flow rate of airflow delivered into one or more of the heat generating devices 102a, 202a-202n to provide one or both of uniform inlet and outlet temperatures. In addition, or alternatively, the method 400 may be implemented to substantially control at least one of the temperature and the flow rate of the airflow exhausted from one or more of the heat generating devices 102, 202a-202n. The method 400 may be implemented as a substantially stand-alone airflow control method. In other words, the method 400 may be employed to substantially control airflow around the heat generating devices 102, 202a-202n substantially independently of a larger scale air conditioning unit, such as, the AC units 214a-214n.

In any event, the method 400 may be initiated at step 402 in response to any of a number of stimuli or conditions. For instance, the method 400 may be initiated with activation of one or more devices, such as, the AC units 214a-214n, a secondary heat exchanger 310, the components 154, etc. In addition, or alternatively, the method 400 may be manually initiated or the controller 304 may be programmed to initiate the method 400 at various times, for a set duration of time, substantially continuously, etc.

Once the method 400 has been initiated, the controller 304 may receive one or more conditions detected by the sensors 308, as indicated at step 404. The one or more conditions received by the controller 304 may include, for instance, temperatures detected at one or more locations with respect to the heat exchangers 116a-116n or the heat generating devices 102, 202a-202n. By way of example, the sensors 308 may be positioned to detect the temperatures of the components 154, the airflow supplied into the components 154, the airflow exhausted from the components 154, the cooling fluid entering or exiting the heat exchangers 116a-116n, etc. In addition, or alternatively, the one or more conditions received by the controller 304 may comprise airflow rates through the components 154, which may be detected in a number of manners as described hereinabove with respect to FIG. 3A.

At step 406, the controller 304 may determine whether the detected condition(s) are within predefined ranges. In addition, the controller 304 may control at least one of the actuators 306 to vary a characteristic of the airflow around the one or more heat generating devices 102, 202a-202n in response to the detected condition(s) being outside of the predefined ranges, as indicated at step 408. Various manners in which the controller 304 may operate to vary the airflow characteristic are described in the following examples.

In a first example, the condition detected comprises the temperatures around the components 154. In this example, the sensors 308 may comprise temperature sensors positioned in, on, or near the components 154. As such, the sensors 308 may be configured to detect at least one of the temperature of the airflow supplied into the components 154, the temperature of the airflow inside of the components 154, and the temperature of the airflow exhausted from the components 154. In addition, the controller 304 may be configured to compare the detected temperatures to a predefined range of temperatures. The predefined range of temperatures may include, for instance, suitable temperatures as suggested by the component 154 manufacturers, temperatures determined through testing as being suitable, temperatures that promote energy efficiency while remaining within safe operating levels, etc.

Also in this example, if the actuators 306 comprise the valves 118a-118n, the controller 304 may operate the valves 118a-118n to vary the cooling fluid flow through the heat exchangers 116a-116n, at step 408. More particularly, for instance, if the detected temperature around a component 154 is outside of the predefined range, the controller 304 may control a valve 118a positioned to control cooling fluid flow through a heat exchanger 116a positioned to vary a characteristic of the airflow around that component 154. The controller 304 may thus increase the opening in the valve 118a to enable a greater supply of cooling fluid to flow through the heat exchanger 116a in response to the detected temperature around the component 154 being above the predefined range. As such, one or both of the temperature of the airflow delivered into the component 154 and the temperature of the airflow exhausted from the component 154 may be reduced.

Alternatively, the controller 304 may decrease the opening in the valve 118a to reduce the supply of cooling fluid through the heat exchanger 116a in response to the detected temperature around the component 154 being below the predefined range to thereby increase the temperature of the airflow around the component 154, at step 408. In this instance, the temperature of the airflow may be increased to thereby reduce the amount of energy required to one or both of cool the component 154 or the airflow exhausted from the component 154.

In one respect, the controller 304 may operate the valves 118a-118n to maintain substantially uniform temperature of airflow around variously positioned components 154. More particularly, for instance, the controller 304 may operate the valves 118a-118n to maintain one or both of substantially uniform airflow delivery into the components 154 and substantially uniform airflow exhaust from the components 154 with respect to other components 154.

Further, in this example, if the actuator 306 comprises a fan 168, the controller 304 may control the fan 168 to vary the characteristic of the airflow around the components 154, at step 408. More particularly, for instance, the controller 304 may operate the fan 168 to increase or decrease the airflow through the component 154 in response to the temperature being above the upper limit of the predefined range. Alternatively, the controller 304 may operate the fan 168 to decrease or increase the airflow through the component 154 in response to the temperature being below the lower limit of the predefined range.

In a second example, the condition detected comprises the rate at which air flows through a component 154. In this example, the sensors 308 may comprise anemometers, pressure sensors, power draw sensors, etc. The sensors 308 may also comprise temperature sensors positioned to enable determination of a temperature differential across the component 154, which may be used to estimate the flow rate of airflow through the component 154. In addition, the controller may utilize information from these sensors 308 to determine whether the fans 168 should be activated, and in certain situations, the levels to which the fans 168 are operated. The controller 304 may also utilize the mass flow rate information to control the amount of cooling fluid supplied through the heat exchangers 116a-116n. Thus, for instance, at step 408, the controller 304 may operate at least one of the valves 118a-118n or the fans 168 to vary the rate at which air flows through the component 154 based upon the detected conditions.

In either of the examples above, the controller 304 may also control operations of a secondary heat exchanger 310 configured to cool the cooling fluid supplied through the heat exchangers 116a-116n. More particularly, for instance, the controller 304 may receive information pertaining to the cooling fluid from a sensor 314, at step 404, and may operate the secondary heat exchanger 310 based upon that information, at step 408.

If the cooling fluid comprises chilled fluid (FIG. 1A), such as, chilled water, for instance, the sensor 314 may be configured to detect the temperature of the chilled fluid either before or after flowing through the evaporator 124 along the coolant line 112. In addition, the controller 304 may determine whether the temperature of the chilled fluid is within a predefined range at step 406. If the temperature of the chilled fluid is outside of the predefined range, the controller 304 may operate the secondary heat exchanger 310 to substantially ensure that the temperature of the chilled fluid supplied to the heat exchangers 116a-116n is within the predefined temperature range.

If the cooling fluid comprises a refrigerant (FIG. 1B), for instance, the sensor 314 may be configured to detect the temperature of the refrigerant either before or after flowing through the heat exchangers 116a-116n. In addition, or alternatively, the sensor 314 may be configured to detect the superheat level of the refrigerant exiting from the heat exchangers 116a-116n. In either case, the sensor 314 may communicate the detected conditions to the controller 304 at step 404. The controller 304 may compare the detected conditions with predefined ranges of conditions at step 406. In addition, at step 408, the controller 304 may actuate one or more devices of the secondary heat exchanger 310 based upon the comparison of the detected conditions with the predefined ranges.

According to a further example, the secondary heat exchanger 310 may be controlled by a separate controller (not shown) or the secondary heat exchanger 310 may be manually controllable. In this example, control over the secondary heat exchanger 310 may be substantially independent over control over the heat exchangers 116a-116n. In a yet further example, the secondary heat exchanger 310 may have discrete power states, for instance, an "on" and an "off" power state. In this example, the secondary heat exchanger 310 may cool the cooling fluid at the same levels regardless of the cooling fluid temperature or superheat condition.

At step 410, the controller 304 may determine whether the method 400 is to continue. If a "no" condition is reached at step 410, the method 400 may end as indicated at step 412. The method 400 may end, for instance, following a predetermined length of time, following a predetermined number of iterations, manually discontinued, etc. If a "yes" condition is reached at step 410, the method 400 may continue beginning at step 404. In addition, steps 406-410 may be repeated substantially continuously to thereby enable substantially continuous detection and control over the airflow around a heat generating device 102, 202a-202n equipped with the heat exchangers 116a-116n.

The method 400 may also be implemented by a resource manager 230 in controlling the airflow around one or more heat generating device 102, 202a-202n in a room 200 comprising multiple heat generating devices 202a-202n and one or more AC units 214a-214n. In other words, the resource manager 230 may implement the method 400 to control cooling of the components 154 housed in the one or more heat generating devices 102, 202a-202n through a more global control scheme than the description above.

In this regard, for instance, the resource manager 230 may receive detected condition information at step 404 as described above. In addition, at step 404, the resource manager 230 may receive information pertaining to the power consumption levels of one or more device-level cooling systems 354a-354n and one or more AC units 214a-214n. At step 404, the resource manager 230 may also receive detected condition information from other sensors 358 variously located in the room 200. For instance, the resource manager 230 may receive detected condition information from sensors 358 positioned to detect the temperature of airflow returning into the AC units 214a-214n.

At step 406, the resource manager 230 may determine whether the detected conditions are within predefined ranges. More particularly, for instance, the resource manager 230 may determine whether one or both of the detected temperatures and the airflow rates of the device-level cooling systems 354a-354n are within predefined ranges as described above. In addition, the resource manager 230 may determine whether the detected conditions with respect to the AC unit 214a-214n operations are within predefined ranges. The resource manager 230 may determine, for instance, that a detected condition is outside of a predefined range for a particular AC unit 214a setting. Depending upon the results of the determination performed at step 406, the resource manager 230 may operate one or more actuators 306, 380 to bring the detected conditions within their respective predefined ranges, at step 408. More particularly, for instance, with respect to the AC units 214a-214n, the resource manager 230 may operate one or more actuators 380 to decrease the temperature or increase the supply rate of the airflow supplied by those AC units 214a-214n having associated conditions that are above predefined temperature ranges.

In a second example, the resource manager 230 may determine whether the AC units 214a-214n and the device-level cooling systems 354a-354n are operating at substantially optimized levels. More particularly, for instance, the resource manager 230 may determine the total power consumed through operation of the device-level cooling systems 354a-354n and the AC units 214a-214n and may determine whether the total power consumption level is within a predefined power consumption level range, at step 406. The predefined power consumption level range may correspond to desired energy consumption levels in cooling the airflow in the room 200. In addition, the resource manager 230 may operate the AC units 214a-214n and the device-level cooling systems 354a-354n in manners to substantially minimize the energy consumption levels while maintaining conditions in the room 200 at desired levels, at step 408.

In a third example, the resource manager 230 may determine whether adverse heated airflow re-circulation is occurring at one or more locations in the room 200. In this regard, for instance, the resource manager 230 may compare various temperatures, for instance, at the inlets and the outlets of the heat generating devices 202a-202n to determine whether there is adverse heated airflow re-circulation, at step 406. For those locations having adverse heated airflow re-circulation, the resource manager 230 may control actuators 306 of one or more device-level cooling systems 354a-354n in the vicinities of the detected adverse heated airflow re-circulations to thereby decrease the temperatures of the airflow exhausted from their associated heat generating devices, at step 408. In this regard, the resource manager 230 may operate to reduce some or all of the inefficiencies caused by the adverse heated airflow re-circulation in the room 200.

At step 410, the resource manager 230 may determine whether the method 400 is to continue. If a "no" condition is reached at step 410, the method 400 may end as indicated at step 412. The method 400 may end, for instance, following a predetermined length of time, following a predetermined number of iterations, manually discontinued, etc. If a "yes" condition is reached at step 410, the method 400 may continue beginning at step 404. In addition, steps 406-410 may be repeated substantially continuously to thereby enable substantially continuous detection and control over the airflow around a heat generating device 102, 202a-202n equipped with the device-level cooling systems 354a-354n and the AC units 214a-214n.

The operations set forth in the method 400 may be contained as a utility, program, or subprogram, in any desired computer accessible medium. In addition, the method 400 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
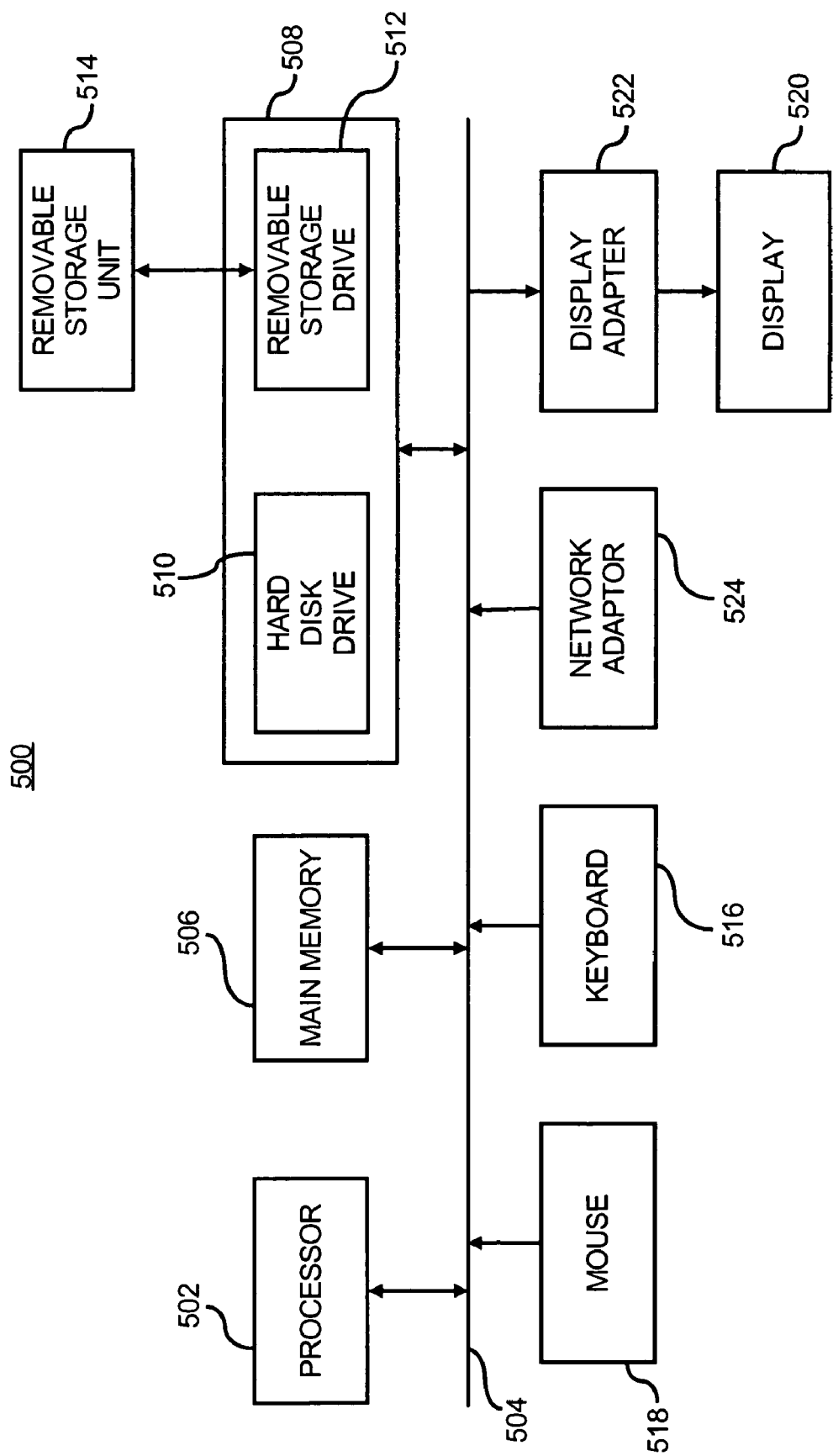
FIG. 5 shows a schematic diagram of a computer system, which may be employed to perform the various functions of the cooling systems depicted in FIGS. 3A and 3B, according to an embodiment of the invention.

FIG. 5 illustrates a computer system 500, which may be employed to perform the various functions of the controller 304 and the resource manager 230 described hereinabove, according to an embodiment. In this respect, the computer system 500 may be used as a platform for executing one or more of the functions described hereinabove with respect to the controller 304 and the resource manager 230.

The computer system 500 includes one or more controllers, such as a processor 502. The processor 502 may be used to execute some or all of the steps described in the method 400. Commands and data from the processor 502 are communicated over a communication bus 504. The computer system 500 also includes a main memory 506, such as a random access memory (RAM), where the program code for, for instance, the controller 304 and the resource manager 230, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the environmental control system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a heat generating device in a room, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for controlling airflow around an air-cooled heat generating device having components, said system comprising:
   a cooling fluid line containing a cooling fluid;
   heat exchangers positioned along the cooling fluid line to cool airflow around the components in the heat generating device, wherein the heat exchangers are positioned adjacent to the heat generating device such that the heat exchangers are directly in the path of at least one of airflow supplied into the components and airflow exhausted from the components;
   valves positioned along the cooling fluid line to individually control cooling fluid flow through respective heat exchangers;
   a secondary heat exchanger configured to absorb heat from the cooling fluid; and
   a controller configured to control the valves to independently control the cooling fluid flow through the heat exchangers.

2. The system according to claim 1, further comprising:
   sensors positioned to detect a condition around the components; and
   wherein the controller is configured to receive the detected condition and to control the cooling fluid flow through the heat exchangers based upon the detected condition.

3. The system according to claim 1, wherein the controller is configured to individually control the valves to maintain substantially uniform temperatures of airflow around the components.

4. The system according to claim 1, wherein the components have inlets for receiving airflow, and wherein the heat exchangers are positioned upstream of the component inlets to thereby cool airflow supplied into the components.

5. The system according to claim 1, wherein the components have outlets for exhausting airflow, and wherein the heat exchangers are positioned downstream of the component outlets to thereby cool airflow exhausted from the components.

6. The system according to claim 1, further comprising:
   at least one fan positioned with respect to the heat exchangers for increasing airflow through the heat exchangers.

7. The system according to claim 6, wherein the controller is further configured to variably control the at least one fan to vary airflow supplied through respective heat exchangers.

8. The system according to claim 1, wherein the cooling fluid comprises a chilled fluid and the secondary heat exchanger comprises a refrigeration loop through which a refrigerant flows, the secondary heat exchanger also having an evaporator positioned along the refrigeration loop, wherein heat is transferred from the chilled fluid to the refrigerant in the evaporator.

9. The system according to claim 1, wherein the cooling fluid comprises a refrigerant and wherein the secondary heat exchanger is positioned along the cooling fluid line and includes a refrigeration loop, wherein the heat exchangers comprise evaporators along the refrigeration loop.

10. The system according to claim 1, wherein at least one of the heat exchangers is attached along the cooling fluid line through couplings configured to removably attach the at least one of the heat exchangers to the cooling fluid line.

11. A room comprising:
    heat generating devices containing heat generating components;
    an air conditioning unit configured to cool the heat generating components by cooling airflow in the room; and
    at least one cooling system comprising heat exchangers positioned adjacent to at least one of the heat generating devices such that the at least one cooling system is configured to cool airflow around the at least one heat generating devices to thereby supplement the cooling performed by the air conditioning unit, wherein the heat exchangers are positioned along individual cooling fluid lines and wherein a valve is positioned along each of the individual cooling fluid lines, said at least one cooling system further comprising a controller configured to control the valves to independently vary cooling fluid flow through each of the heat exchangers.

12. The room according to claim 11, where the heat generating components have inlets for receiving airflow, and wherein the heat exchangers are positioned upstream of the inlets to thereby supplement cooling of airflow supplied into the heat generating components.

13. The room according to claim 11, where the heat generating components have outlets for exhausting airflow, and wherein the heat exchangers are positioned downstream of the outlets to thereby cool airflow exhausted from the heat generating components.

14. The room according to claim 11, further comprising:
    sensors positioned at various locations of the room; and
    a resource manager configured to receive detected conditions from the sensors and to control the air conditioning unit based upon the detected conditions.

15. The room according to claim 10, wherein the at least one cooling system comprises a fan positioned to increase airflow through at least one of the heat exchangers.

16. The room according to claim 15, wherein the controller is further configured to variably control the fan to vary airflow supplied through at least one of the heat exchangers.

17. The room according to claim 11, wherein the at least one cooling system comprises a secondary heat exchanger operable to cool a cooling fluid that flows through the heat exchangers.

18. The room according to claim 17, wherein the cooling fluid comprises a chilled fluid and the secondary heat exchanger comprises a refrigeration loop through which a refrigerant flows, the secondary heat exchanger also having an evaporator positioned along the refrigeration loop, wherein heat is transferred from the chilled fluid to the refrigerant in the evaporator.

19. A system for controlling airflow around an air-cooled heat generating device having components, said system comprising:
    a cooling fluid line containing a chilled fluid;
    heat exchangers positioned along the cooling fluid line to cool airflow around the components in the heat generating device, wherein the heat exchangers are positioned adjacent to the heat generating device such that the heat exchangers are directly in the path of at least one of airflow supplied into the components and airflow exhausted from the components;

valves positioned along the cooling fluid line to control cooling fluid flow through respective heat exchangers;

a secondary heat exchanger configured to absorb heat from the cooling fluid, the secondary heat exchanger comprising a refrigeration loop through which a refrigerant flows, wherein the secondary heat exchanger includes an evaporator positioned along the refrigeration loop, and wherein heat is transferred from the chilled fluid to the refrigerant in the evaporator; and a controller configured to control the valves to control the cooling fluid flow through the heat exchangers.

* * * * *